United States Patent
Wood, II

(10) Patent No.: US 7,671,348 B2
(45) Date of Patent: Mar. 2, 2010

(54) HYDROCARBON GETTER FOR LITHOGRAPHIC EXPOSURE TOOLS

(75) Inventor: Obert R. Wood, II, Loudonville, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 310 days.

(21) Appl. No.: 11/768,763

(22) Filed: Jun. 26, 2007

(65) Prior Publication Data

US 2009/0002647 A1 Jan. 1, 2009

(51) Int. Cl.
*G21G 1/10* (2006.01)

(52) U.S. Cl. .................. 250/492.2; 250/492.1

(58) Field of Classification Search .............. 250/492.1, 250/492.2

See application file for complete search history.

(56) References Cited

U.S. PATENT DOCUMENTS

| | | | |
|---|---|---|---|
| 6,533,952 | B2 | 3/2003 | Klebanoff et al. |
| 6,664,554 | B2 | 12/2003 | Klebanoff et al. |
| 2002/0083409 | A1 | 6/2002 | Hamm |
| 2004/0218157 | A1 | 11/2004 | Bakker et al. |
| 2005/0122491 | A1 | 6/2005 | Bakker et al. |
| 2007/0054497 | A1 | 3/2007 | Weiss et al. |
| 2007/0138414 | A1 | 6/2007 | Stevens et al. |

FOREIGN PATENT DOCUMENTS

| | | |
|---|---|---|
| EP | 1213617 A1 | 6/2002 |
| WO | 2006011105 A2 | 2/2006 |
| WO | 2008034582 A2 | 3/2008 |

OTHER PUBLICATIONS

International Search Report and Written Opinion, PCT/US2008/007956, Advanced Micro Devices, Inc., pp. 1-13, Dec. 29, 2008.

S. Matsunari, et al., "Carbon deposition on multi-layer mirrors by extreme ultra violet ray irradiation," Mar. 21, 2007, Proceedings of SPIE, Emerging Lithographic Technologies XI, vol. 6517.

A. A. Macdowell, et al., "Soft x-ray projection lithography using a 1:1 ring field optical system," J. Vac. Sci. Technol., Nov./Dec. 1991, pp. 3193-3197, vol. 9, No. 6, American Vacuum Society.

(Continued)

*Primary Examiner*—Jack I Berman
*Assistant Examiner*—Hanway Chang
(74) *Attorney, Agent, or Firm*—Ditthavong, Mori & Steiner, P.C.

(57) ABSTRACT

Carbon contamination of optical elements in an exposure tool is minimized by incorporating a hydrocarbon getter. Embodiments include EUV lithography tools provided with at least one hydrocarbon getter comprising a substrate and a high energy source, such as an electron gun or separate EUV source, positioned to direct an energy beam, having sufficient energy to crack heavy hydrocarbons and form carbon, on the substrate. Embodiments also include exposure tools equipped with a hydrocarbon getter comprising an energy source positioned to impinge a beam of energy on a quartz crystal thickness monitor, a residual gas analyzer, and a controller to control the electron-current and maintain the amount of hydrocarbons in the system at a predetermined low level.

20 Claims, 3 Drawing Sheets

OTHER PUBLICATIONS

R.R. Kunz, et al., "Experimentation and modeling of organic photocontamination on lithographic optics," J. Vac. Sci. Technol., May/Jun. 2000, pp. 1306-1313, vol. 18, No. 3, American Vacuum Society.

Jeromy Hollenshead, et al., "Modeling radiation-induced carbon contamination of extreme ultraviolet optics," J. Vac. Sci. Technol., Jan./Feb. 2006, pp. 64-82, vol. 24, No. 1, American Vacuum Society.

Christopher G. Shaw, "Wavelength and coverage dependence of spacecraft contaminant photodeposition," Proceedings of SPIE, Nov. 11, 1996, pp. 258-268.

W. Miles Clift, et al., "Scaling studies of capping layer oxidation by water exposure with EUV radiation and electrons," Emerging Lithographic Technologies VIII, Proceedings of SPIE, May 20, 2004, pp. 666-674, vol. 5374.

"Getter," Wikipedia, http://en.wikipedia.org/wiki/Getter, accessed May 31, 2007.

HYDROCARBON GETTER FOR LITHOGRAPHIC EXPOSURE TOOLS

FIELD OF THE INVENTION

The present invention relates to the efficient fabrication of semiconductor devices with accurate ultrafine design features. The present invention is particularly applicable to the efficient use of lithographic exposure devices, such as extreme ultraviolet (EUV) lithography devices, by minimizing downtime.

BACKGROUND ART

The dimensions of semiconductor device features relentlessly plunge into the deep sub-micron range challenging conventional fabrication capabilities. As critical dimensions shrink, it becomes increasingly more difficult to achieve high dimensional accuracy in an efficient manner with high manufacturing throughput. The minimum feature size depends upon the chemical and optical limits of a particular lithography system, and the tolerance for distortions. In addition to the limitations of conventional lithography, as dimensions shrink and memory capacity increases, manufacturing costs increase, thereby requiring advances in processing aimed at the efficient use of facilities and high manufacturing throughput. In today's competitive market, a yield of at least 70% is required for profitability.

It has been recently proposed to employ shorter wavelength radiation, e.g., of about 3 to 20 nm. Such radiation is conventionally termed EUV or soft X-ray. Sources include, for example, laser-produced plasma sources, discharge plasma sources, or synchrotron radiation from electron storage rings. Such EUV lithography exposure tools, however, have been problematic. A major source of concern is the contamination of the reflective optical elements during operation due to residual gases from the vacuum atmosphere.

Optical reflective elements for the soft X-ray to EUV wavelength range, such as photomasks or multilayer mirrors, are required for use in EUV lithography of semiconductor components. Typical EUV lithography exposure devices have eight or more reflective optical elements. In order to achieve a sufficient overall intensity of the working radiation, the mirrors must have the highest possible reflectivities, since the overall intensity is proportional to the product of the reflectivities of the individual mirrors. These high reflectivities should be retained by the reflective optical elements if possible throughout their lifetime. Furthermore, the homogeneity of the reflectivity across the surface of the reflective optical element must be preserved for the entire lifetime. The reflectivity and the lifetime of these reflective optical elements are especially impaired by surface contamination in the form of carbon deposits and by surface oxidation during exposure to the operating wavelength.

The reflective optical elements are contaminated during operation by residual gases in the vacuum atmosphere. A contamination mechanism comprises adsorption of residual gases on the surfaces of the reflective optical elements. The adsorbed gases are broken up by the high-energy photon radiation through emission of photoelectrons. When hydrocarbons are present in the residual gas atmosphere, a carbon layer is thus formed, which diminishes the reflectivity of a reflective optical element by around 1% per nm of thickness. At a partial pressure of hydrocarbons of around $10^{-9}$ mbar, a layer of 1 nm thickness will be formed already after around 20 hours. Commercial specifications for projection optics lifetime is a reflectance loss of less than 1% per surface. A 15 Å thick film of carbon in the form of graphite would reduce the reflectivity of an EUV optic by 2%. Since, for example, EUV lithography devices with a reflectivity loss of 1% per reflective optical element no longer allow the necessary production pace, this contamination layer must be removed by a cleaning process which typically takes up to 5 hours, thereby reducing manufacturing throughput. Moreover, such cleaning is likely to damage the surface of the reflective optical element, as by roughening or oxidizing the surface, thereby preventing the initial reflectivity from being regained.

Conventional approaches to the carbon deposition problem also include the use of EUV imaging optics comprising multilayers of various elemental combinations deposited on glass substrates. Silicon has historically been chosen for the final capping layer because it is less susceptible to oxidation than molybdenum when exposed to air. However, silicon is susceptible to rapid EUV-induced oxidation by water vapor. Ruthenium (Ru) has shown promise as an alternative capping layer, because it is less sensitive to radiation-induced oxidation. However, Ru-capped multilayers are susceptible to carbon deposition. To ensure maximum EUV exposure, it is imperative that EUV optics be maintained as clean as possible during operation.

Accordingly, a need exists for lithographic exposure tools, particularly EUV lithography exposure tools, with reduced carbon contamination on the reflective elements during use. There also exists a need for methodology enabling careful control of the hydrocarbon level such that it is sufficiently high enough to protect the fragile multilayer reflective layers from oxidation, but low enough to avoid carbon build up on the optical elements due to cracking of the hydrocarbons by EUV radiation.

DISCLOSURE OF THE INVENTION

An advantage of the present invention is a lithographic exposure device with reduced carbon deposition on optical elements during use.

Another advantage of the present invention is an EUV lithography exposure tool capable of maintaining hydrocarbon levels to avoid adverse oxidation of and adverse carbon deposition on reflective optical elements.

A further advantage of the present invention is a method of reducing carbon deposition on the reflective optical elements of an EUV device.

Another advantage of the present invention is a method of controlling the amount of hydrocarbons in an EUV lithography exposure device to a level sufficient to prevent oxidation of and minimize carbon deposition on reflective optical elements.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a lithographic exposure device comprising a hydrocarbon getter.

Another advantage of the present invention is an extreme ultraviolet (EUV) lithography exposure device comprising: a primary EUV source, a reflective optical element for the soft X-ray or EUV wavelength radiation range; and a hydrocarbon getter comprising a substrate and an electron gun or a separate EUV source positioned to direct an energy beam at the substrate.

A further advantage of the present invention is a method of reducing carbon deposition in a lithographic exposure device, the method comprising incorporating a hydrocarbon getter in the lithographic exposure device.

Embodiments of the present invention include EUV lithography exposure devices comprising a conventional primary EUV source and at least one hydrocarbon getter comprising a substrate and a high energy source positioned to direct an energy beam at the substrate, the energy beam having sufficient strength to crack hydrocarbons in the system, e.g., a strength at least as great as the energy beam emitted by the primary EUV source. Suitable high energy sources include an electron gun and a separate EUV source. Suitable substrates include glass, metal, such as Ru, metal coated glass, and quartz crystal thickness monitors. Embodiments of the present invention include EUV lithography exposure tools comprising a residual gas analyzer for determining the hydrocarbon level in the device and a controller for controlling the electron beam current, in response to the measured thickness of the carbon deposited on a quartz crystal thickness monitor, to control the amount of hydrocarbons at a predetermined low level sufficient to prevent oxidation and adverse carbon contamination of reflective optical elements.

Additional advantages of the present invention will become readily apparent to those skilled in the art from the following detailed description, wherein embodiments of the present invention are described, simply by way of illustration of the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
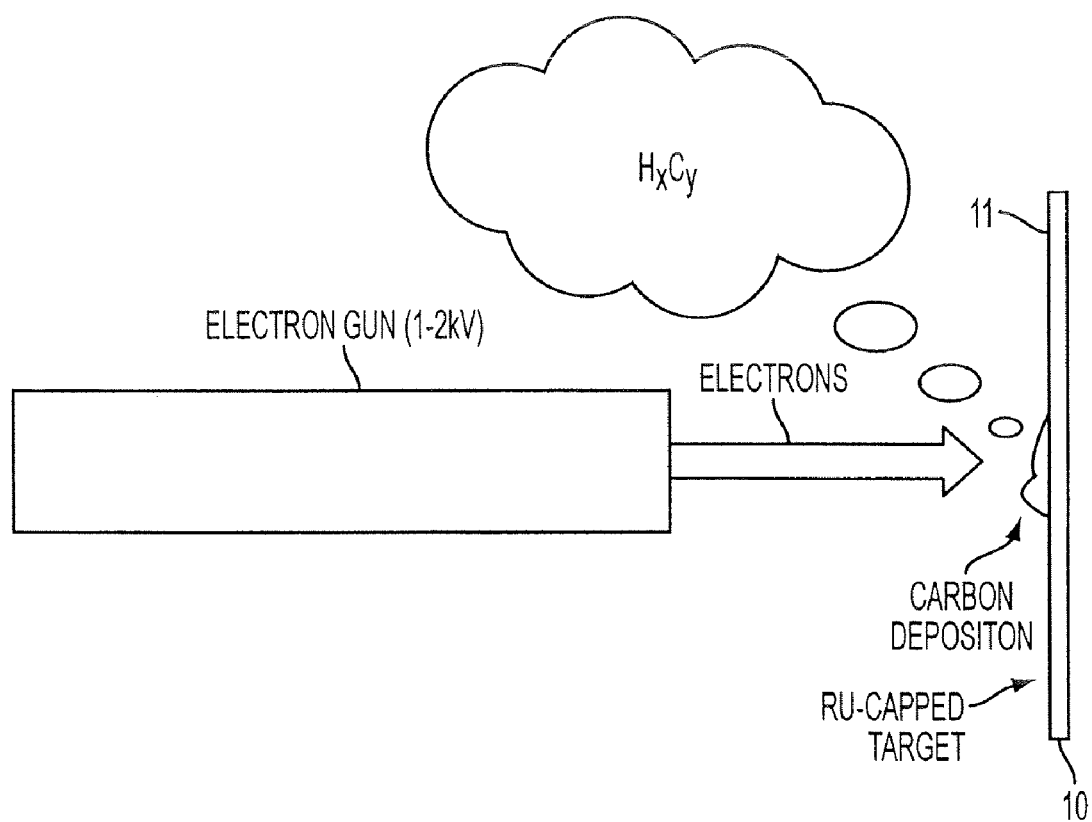
FIG. 1 schematically illustrates an electron beam hydrocarbon getter in accordance with an embodiment of the present invention.

The present invention addresses and solves problems attendant upon the use of lithographic exposure tools, such as lithographic exposure tools that operate under a very short wavelength, e.g., soft X-ray and EUV wavelength range radiation, by minimizing and controlling carbon deposition on and preventing oxidation of reflective optical elements, thereby reducing downtime and increasing manufacturing throughput.

Embodiments of the present invention include carefully controlling the partial pressure of heavy hydrocarbons in an EUV lithography exposure tool, such as at a level of about $10^{-9}$ mbar to about $10^{-7}$ mbar, so that it is high enough to prevent oxidation of the reflective optical coatings but low enough to avoid rapid build up of a carbon film thereon. Carbon contamination results from hydrocarbon cracking by EUV radiation from the primary EUV source of the exposure tool.

Embodiments of the present invention include positioning a hydrocarbon getter in a conventional lithographic exposure tool, such as a conventional EUV lithography exposure tool. Embodiments of the present invention include lithographic exposure tools with at least one hydrocarbon getter, comprising a substrate and a high energy source positioned to impinge a beam having an energy sufficient to crack hydrocarbons and form a carbon film on the substrate. Suitable energy sources used in embodiments of the present invention are capable of generating an energy beam having a strength at least as great as that generated by the primary EUV source of the exposure tool, such as a separate EUV source or an electron gun, e.g., an electron gun operating at 1-2 kV. Suitable substrates for use in hydrocarbon getters according to embodiments of the present invention include glass, quartz, and quartz crystal thickness monitors, with or without a metal coating, such as a Ru coating, laminates, and metal substrates. By scavenging the hydrocarbons using a getter in accordance with embodiments of the present invention, the amount of hydrocarbons available to be cracked into carbon and form deposits on the reflective optical elements is significantly reduced.

Embodiments of the present invention also include EUV lithography exposure tools with a hydrocarbon getter comprising an electron gun and a quartz crystal thickness monitor, or a metal, e.g. Ru, coated quartz crystal thickness monitor. In such tools, a residual gas analyzer is incorporated to determine the amount of hydrocarbons in the system, and a controller is provided. In response to the rate of carbon deposited on the quartz crystal thickness monitor, the controller controls the electron beam current such that the amount of hydrocarbons in the system, as determined by the residual gas analyzer, is maintained at a predetermined low, but finite level, such as at a partial pressure of about $10^{-9}$ mbar to about $10^{-7}$ mbar. In this way, the amount of hydrocarbons is maintained at a level sufficient to prevent oxidation of the delicate reflective optical elements, but low enough to prevent carbon coatings from rapidly building up thereon, thereby significantly reducing downtime and increasing manufacturing throughput.

A hydrocarbon getter in accordance with an embodiment of the present invention is schematically illustrated in FIG. 1 and comprises an electron gun that operates at 1-2 kV. The electron gun is positioned to impinge electrons directly on the surface of a substrate, such as comprising a glass substrate 10 with a layer of Ru deposited thereon, as at a thickness of about 2 nm to about 200 nm. Hydrocarbons ($H_xC_y$) in the system, particularly heavy hydrocarbons, e.g., with masses between 44 and 200 atomic mass units (AMU), in the vicinity of the substrate are cracked by the electrons from the electron gun, thereby forming a carbon film on the substrate. The hydrocarbons cracked into carbon and deposited on the substrate are unavailable to be cracked by EUV radiation generated by the primary EUV source of the lithographic exposure tool to deposit carbon on reflective optical elements.

Figure 2:
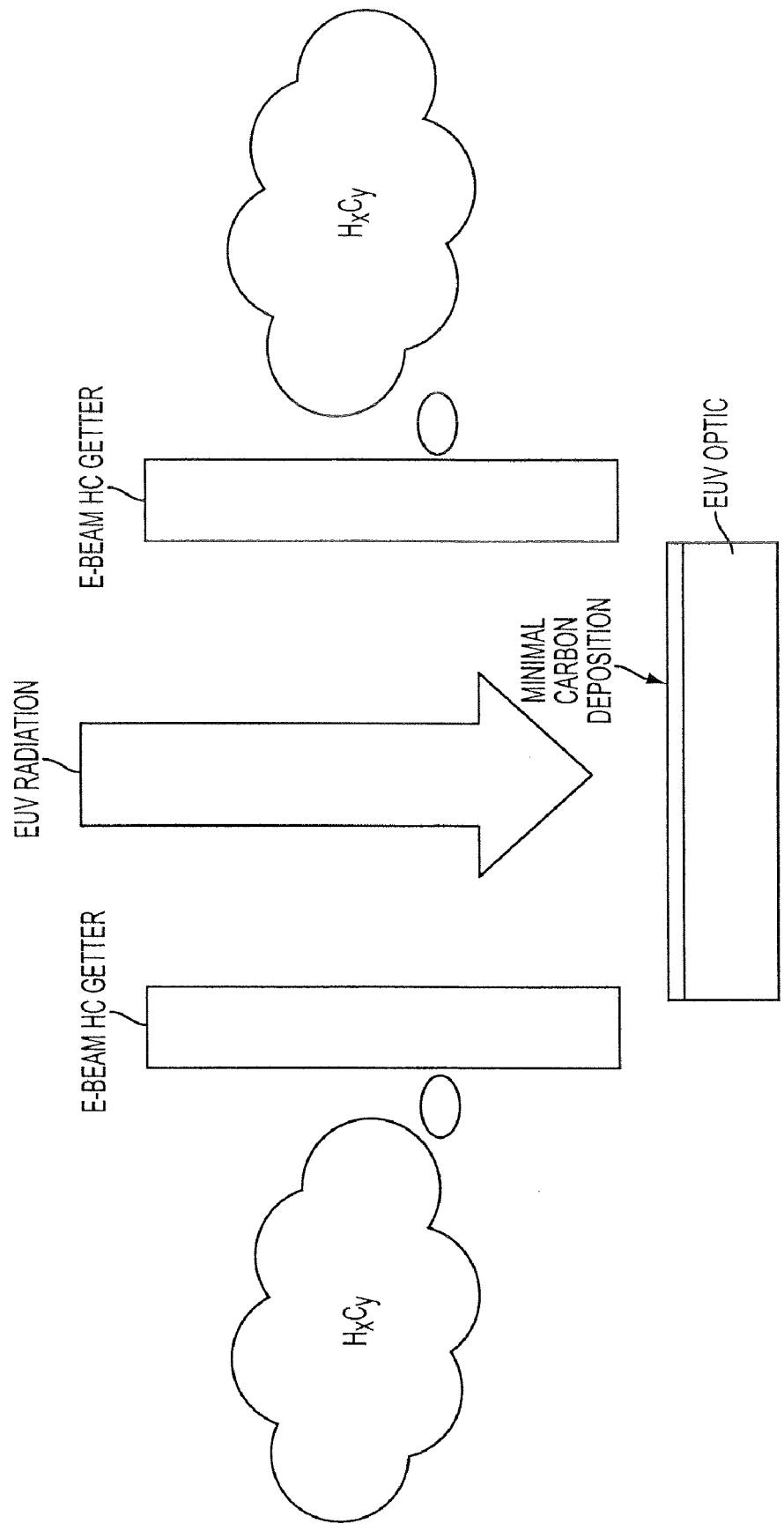
FIG. 2 schematically illustrates the use of electron beam hydrocarbon getters to minimize carbon deposition on reflective optical elements in accordance with an embodiment of the present invention.

In FIG. 2 there is schematically illustrated the interior of an EUV lithography exposure tool comprising an EUV optic with EUV radiation impinging thereon. Two electron beam hydrocarbon getters, such as that illustrated in FIG. 1, are positioned in sufficient proximity to the EUV optic such that carbon would be preferentially deposited on the substrates of the getters, thereby significantly reducing carbon deposition on the EUV optic. In embodiments of the present invention, a hydrocarbon getter can be positioned at a distance of about 1 cm to about 10 cm from the EUV optic.

Figure 3:
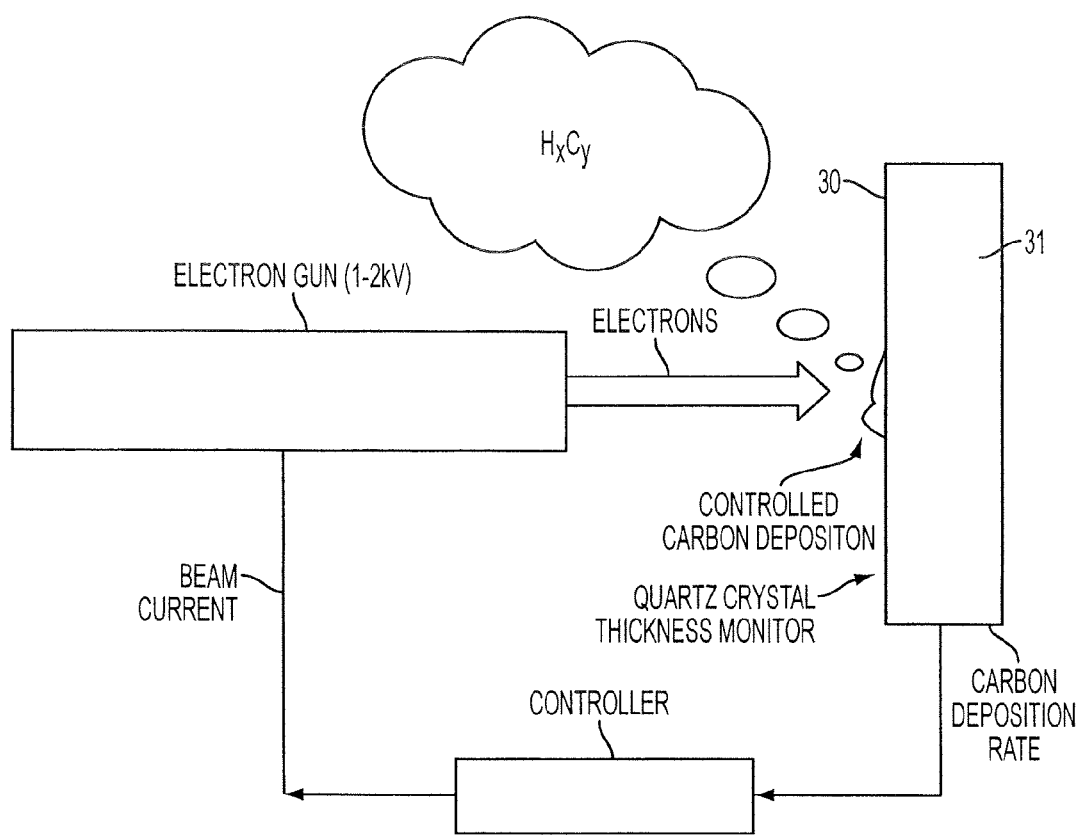
FIG. 3 schematically illustrates an embodiment of the present invention for controlling the hydrocarbon level in an EUV lithography exposure tool.

In another embodiment of the present invention, as schematically illustrated in FIG. 3, an EUV lithography exposure tool is provided with a hydrocarbon getter comprising an electron gun positioned to impinge electrons on a substrate comprising an optional Ru coating 30, as at a thickness of about 2 nm to about 200 nm, on a quartz crystal thickness monitor 31. The rate of carbon deposition on the Ru coating is recorded by the quartz crystal thickness monitor. A controller monitors the rate of carbon deposition and controls the electron beam current such that the hydrocarbon level in the system is maintained within a predetermined low level, as measured by a residual gas analyzer (not shown for illustrative convenience). Typically, the hydrocarbon level is maintained at a partial pressure of about $10^{-9}$ mbar to about $10^{-7}$ mbar, which is sufficiently high to prevent oxidation of the delicate optical elements but sufficiently low to minimize carbon deposition thereon, thereby extending the useful life of the tool and avoiding frequent downtime for cleaning.

In accordance with embodiments of the present invention, EUV induced carbon deposition on the EUV optics is minimized and controlled by employing a hydrocarbon getter. Radiation-induced chemical phenomena at the surfaces of EUV optics are known to be qualitatively the same whether the incident radiation is EUV photons or 1-2 keV electrons as long as the number of secondary electrons generated is similar. For example, incident electron current densities of 5 $\mu A/mm^2$ at 2 keV beam energy have been shown to generate ~5 $\mu A/mm^2$ of secondary electrons. This is about the same as the secondary photoemission current observed when an EUV optic is exposed to 13.4 nm radiation at a power density of ~10 $mW/mm^2$. A power density of ~10 $mW/mm^2$ lies at the high end of the range of power densities that will be present in a commercial EUVL exposure tool. Therefore, the use of a hydrocarbon getter in accordance with embodiments of the present invention mimics hydrocarbon cracking by EUV photons, reducing the amount of hydrocarbons available for deposition on delicate optical elements of the EUV tool. Accordingly, hydrocarbon getters in accordance with embodiments of the present invention include energy sources capable of generating a beam having an energy sufficient to crack heavy hydrocarbons to deposit carbon, such as an energy of 1-2 KeV or at a power density of at least ~10 $mW/mm^2$.

The present invention enables the efficient use of lithographic exposure devices, particularly EUV lithography exposure devices, by providing a getter to scavenge hydrocarbons, thereby preventing excess carbon deposition on optical elements. Embodiments of the present invention enable the use of EUV lithography exposure tools for longer periods of time before the need for in-situ cleaning, thereby extending the useful lifetime of the optical elements and increasing manufacturing throughput. Embodiments of the present invention enable control of the amount of hydrocarbons in an EUV lithography exposure tool at a level sufficient to prevent oxidation of reflective optical elements and sufficient to minimize carbon deposition thereon.

The present invention enables the fabrication of semiconductor chips comprising devices with accurately formed features in the deep sub-micron range, in an efficient manner at high manufacturing throughput and high yield. The present invention enjoys industrial utility in fabricating semiconductor chips comprising any of various types of semiconductor devices, including semiconductor memory devices, such as erasable, programmable, read-only memories (EEPROMs), and flash erasable programmable read-only memories (FEPROMs).

In the preceding description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not as restrictive. It is understood that the present invention is capable of using various other combinations and embodiments and is capable of any changes or modifications within the scope of the inventive concept as expressed herein.

What is claimed is:

1. A lithographic exposure device comprising a reflective optical element and a hydrocarbon getter positioned in sufficient proximity to the reflective optical element to reduce carbon deposition thereon; and a controller for controlling an energy beam to maintain the amount of hydrocarbons in the system at a predetermined level.

2. The device according to claim 1, wherein the hydrocarbon getter comprises a substrate and a high energy source positioned to direct the energy beam, having sufficient energy to crack the hydrocarbons and form carbon, on the substrate.

3. The device according to claim 2, which is an extreme ultraviolet (EUV) lithography exposure device comprising a primary EUV source and at least one reflective optical element for soft X-ray or extreme ultraviolet wavelength (EUV) range radiation, wherein the hydrocarbon getter energy source is capable of directing a beam having an energy at least as great as that generated by the primary EUV source.

4. The device according to claim 3, wherein the energy source is an electron gun or a separate EUV source.

5. The device according to claim 4, wherein the substrate comprises a metal coating.

6. The device according to claim 5, wherein the substrate comprises ruthenium (Ru)-coated glass.

7. The device according to claim 4, wherein the energy source is an electron gun.

8. The device according to claim 3, wherein the substrate comprises a quartz crystal thickness monitor.

9. The device according to claim 8, further comprising: a residual gas analyzer for determining the hydrocarbon level in the device.

10. The device according to claim 9, wherein the controller controls the beam current in response to a thickness of carbon deposited on the substrate.

11. The device according to claim 1, wherein the hydrocarbon getter is positioned at a distance of 1 cm to 10 cm from the reflective optical element.

12. An extreme ultraviolet (EUV) lithography exposure device comprising:
    a primary EUV source;
    a reflective optical element for the soft X-ray or EUV wavelength range radiation;
    a hydrocarbon getter comprising a substrate and an electron gun or a separate EUV source positioned to direct an energy beam at the substrate;
    a residual gas analyzer for determining the amount of hydrocarbons in the device; and
    a controller for controlling the beam current to maintain the amount of hydrocarbons in the system at a predetermined level.

13. The device according to claim 12, wherein the substrate comprises a quartz crystal thickness monitor.

14. The device according to claim 12, wherein the controller controls the beam current in response to a thickness of carbon deposited on the substrate.

15. A method of reducing carbon deposition on a reflective element of a lithographic exposure device, the method comprising positioning a hydrocarbon getter in the lithographic exposure device in sufficient proximity to the reflective element to reduce carbon deposition thereon; and controlling the strength of an enemy beam in response to the measured thickness of the deposited carbon to maintain the amount of hydrocarbons in the device at a predetermined level.

16. The method according to claim 15, wherein the hydrocarbon getter comprises a substrate and a high energy source positioned to impinge the energy beam on the substrate.

17. The method according to claim 16, wherein:

the lithographic exposure device comprises a primary extreme ultraviolet (EUV) source and at least one reflective optical element for the soft X-ray or EUV wavelength radiation range; and the energy source comprises an electron gun or a separate EUV source.

18. The method according to claim 15, comprising:
positioning the hydrocarbon getter at a distance of 1 cm to 10 cm from the reflective element.

19. The method according to claim 18, wherein the substrate comprises a quartz crystal thickness monitor.

20. The method according to claim 19, further comprising:
determining the amount of hydrocarbons in the device;
measuring the thickness of carbon deposited on the substrate.

* * * * *